United States Patent [19]
Adachi et al.

[11] Patent Number: 5,730,574
[45] Date of Patent: Mar. 24, 1998

[54] TRANSFER APPARATUS FOR AND METHOD OF TRANSFERRING SUBSTRATE

[75] Inventors: Hideki Adachi, Kyoto; Tatsuhiko Inada, Hikone, both of Japan

[73] Assignee: Dainippon Screen Mfg. Co., Ltd., Japan

[21] Appl. No.: 726,196

[22] Filed: Oct. 4, 1996

[30] Foreign Application Priority Data

Oct. 9, 1995 [JP] Japan .................................. 7-261741

[51] Int. Cl.$^6$ ........................................................ B65H 5/00
[52] U.S. Cl. ........................ 414/222; 414/416; 414/937
[58] Field of Search .................................... 414/749, 416, 414/744.5, 222, 223, 937; 118/500; 206/710, 711, 712

[56] References Cited

U.S. PATENT DOCUMENTS

| | | | |
|---|---|---|---|
| 4,836,733 | 6/1989 | Hertel et al. | 414/937 X |
| 5,177,514 | 1/1993 | Ushijima et al. | 414/937 X |
| 5,332,352 | 7/1994 | Poduje et al. | 414/744.5 X |
| 5,404,894 | 4/1995 | Shiraiwa | 118/500 X |
| 5,445,491 | 8/1995 | Nakagawa et al. | 414/937 X |
| 5,478,195 | 12/1995 | Usami | 414/937 X |

FOREIGN PATENT DOCUMENTS 63-50037  10/1996  Japan .

*Primary Examiner*—Donald W. Underwood
*Attorney, Agent, or Firm*—Ostrolenk, Faber, Gerb & Soffen, LLP

[57] ABSTRACT

A transfer apparatus is adapted for transferring a substrate between two processing sections and includes two storage cassettes and two transfer robots. A first storage cassette has an insertion opening inserted in a first direction and a withdrawal opening oriented in a second direction, where the first and second directions intersect. A second storage cassette has an insertion opening oriented in a third direction and a withdrawal opening oriented in a fourth direction which fourth direction intersects the third direction. A first transfer device transfers a substrate from one of the two processing sections to the first storage cassette through the insertion opening of the first storage cassette and then transfers a substrate from the second storage cassette to the one processing section via the withdrawal opening of the second storage cassette. A second transfer device transfers a substrate from the first storage cassette to the other processing section via the withdrawal opening of the first storage cassette and then transfers a substrate from the other processing section to the second storage cassette through the insertion opening of the second storage cassette.

14 Claims, 12 Drawing Sheets

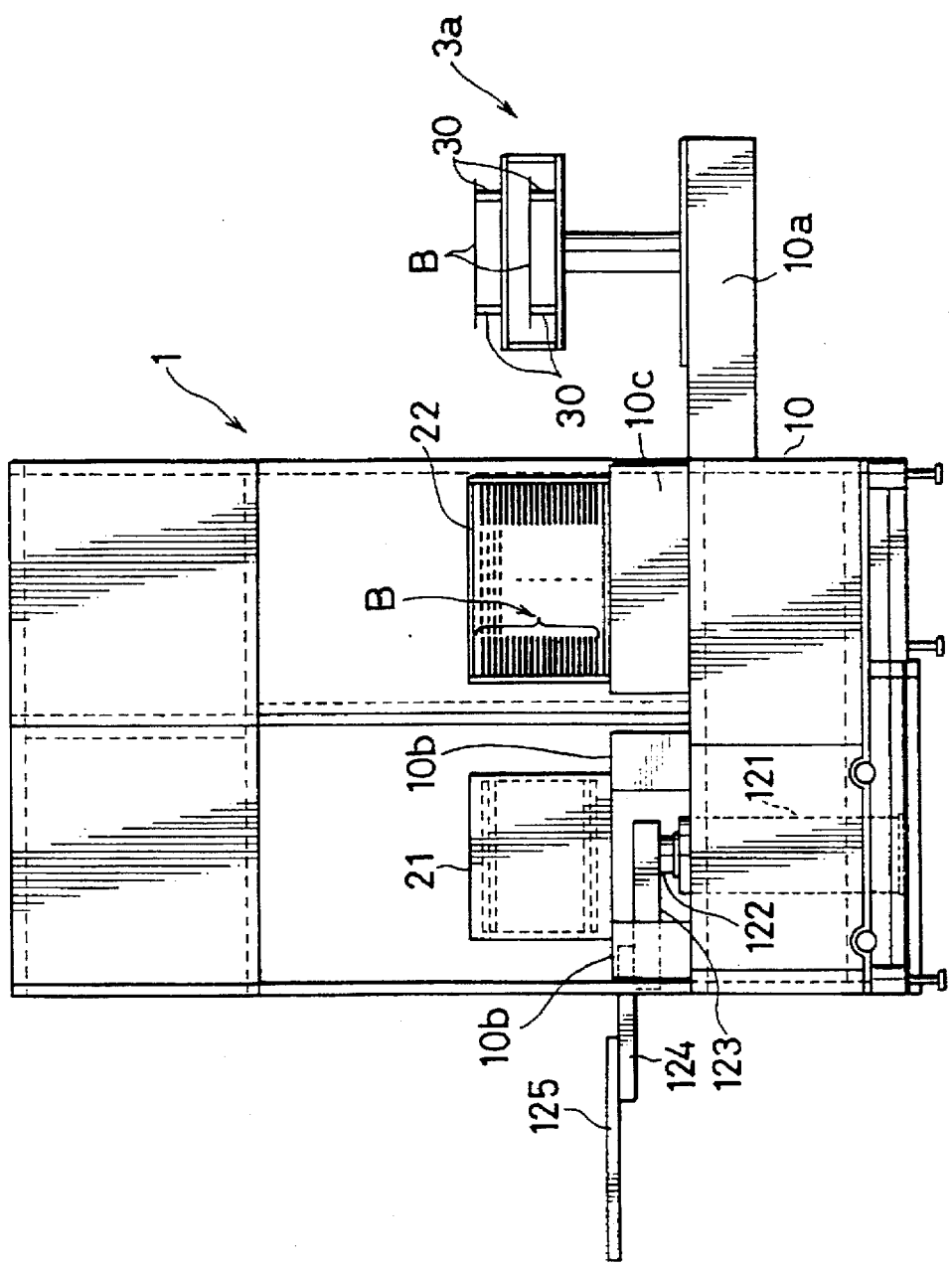

TRANSFER APPARATUS FOR AND METHOD OF TRANSFERRING SUBSTRATE

BACKGROUND OF THE INVENTION

This invention relates to a transfer apparatus for and a method of transferring a substrate between substrate processing sections in a system for processing substrates. Examples of substrates appropriate for the present invention include substrates for liquid crystal displays and substrates for semiconductors.

A substrate processing system is usually constructed of a plurality of processing sections including, a cleaner for cleaning substrates, a resist coater, a dryer, an exposing apparatus and a developing apparatus. Such processing apparatus are essentially divided into three sections: (i) a pre/post processing section including a pre-processing apparatus for treating a substrate before it is exposed, such as a resist coater and a dryer, and a post-processing apparatus for treating the substrate after it is exposed, such as a developer unit; and (ii) an intermediate processing section including an exposing apparatus for exposing the substrate.

In the conventional substrate processing system, a transfer apparatus is provided between the pre/post processing section and the intermediate processing section to transfer the substrate from the pre/post processing section to the intermediate processing section, and vice versa.

The transfer apparatus comprises a transfer robot and storage cassettes for storing the substrates. A substrate having been treated in the pre/post processing section is temporarily stored in the storage cassette. The substrate is then transferred from the storage cassette to the intermediate processing section. After being treated in the intermediate processing section, the substrate is temporarily stored in the storage cassette. Thereafter, the substrate is again transferred to the pre/post processing section.

A known transfer apparatus is shown in the top plan view of the top plan view of FIG. 12. In FIG. 12, a transfer apparatus is indicated at 600 a pre/post processing section is indicated at 610, and an intermediate processing section is indicated at 620. The intermediate processing section 620 is provided with a substrate reception rack 620a.

The transfer apparatus 600 is provided with a support rail 600a extending into the pre/post processing section 610 and a substrate carrier 600b. Also, the transfer apparatus 600 is provided with a first storage cassette 601, a second storage cassette 602, and a transfer robot 603. The first and second storage cassettes 601 and 602 are arranged in series with the directional orientation of the support rail 600a. The transfer robot 603 is reciprocally movable in a parallel direction with the serial arrangement of the first and second storage cassettes 601 and 602. The substrate reception rack 620a is axially aligned with the moving direction of the transfer robot 603.

The transfer robot 603 comprises a first arm 603a, a second arm 603b, and a hand 603c provided at a lead end of the second arm 603b for supporting a substrate. The first arm 603a is rotatable about a vertical axis passing through a main body of the transfer robot 603 and the second arm 603b is rotatable about a vertical axis passing through a distal end of the first arm 603a. The relative rotational movement of the first and second arms 603a, 603b are controlled so that the hand 603c always moves in a radial direction with respect to the transfer robot 603. With this arrangement, the hand 603c can be positioned as desired with respect to the substrate carrier 600b, substrate reception rack 620a, and the first and second storage cassettes 601, 602.

Specifically, a substrate, having been treated may be transferred from the pre/post processing section 610 and temporarily stored in the first storage cassette 601. Thereafter, the substrate may be picked up from the first storage cassette 601 and transferred to the reception rack 620a of the intermediate processing section 620. Upon completion of any treatment within the intermediate processing section 620, the substrate is transferred from the intermediate processing section 620 and temporarily stored in the second storage cassette 602. Thereafter, the substrate is returned to the pre/post processing section 610 undergoes any specified post processing.

More specifically, a substrate is transferred by the substrate carrier 600b from the position shown by the solid lines to the position shown by the broken lines by means of a moving unit (not shown). At the same time, the transfer robot 603 is moved rightward, the hand 603c is extended to grasp the substrate, and then the transfer robot 603 is moved leftward to temporarily store the substrate in the first storage cassette 601. The substrate carrier 600b is then returned to its initial position (as shown by the solid lines in FIG. 12). Subsequent substrate transfers from the pre/post processing section 610 to the first storage cassette 601 are repeatedly performed until a command is initiated to transfer a substrate from the second storage cassette 602 to the pre/post processing section 610.

When a command to transfer a substrate from the first storage cassette 601 to the intermediate processing section 620 is initiated, the transfer robot 603 grasps a substrate which has been stored in the first storage cassette 601 and transfers the substrate to the intermediate processing section 620. The processed substrate is then transferred from the intermediate processing section 620 to the second storage cassette 602 where it is temporarily stored.

When a command to transfer a processed substrate to the pre/post processing section 610 from the second storage cassette 602 is initiated, the substrate carrier 600b is moved to the broken-line position from the solid-line position. Next, the transfer robot 603 picks up a processed substrate from the second storage cassette 602 and then transfers the same to the substrate carrier 600b.

In this conventional transfer apparatus, the single transfer robot 603 is used to transfer a substrate between the first storage cassette 601, the second storage cassette 602, the pre/post processing section 610, and the intermediate processing section 620. However, the pre/post processing section 610 and the intermediate processing section 620 require different amounts of time to process substrates? Accordingly, the time difference between the two sections results in a long operation term and reduces the substrate transfer efficiency. Moreover, when the pre/post processing section comprises a plurality of processing lines, there is a high likelihood that one of the processing lines will be suspended due to a malfunction. Consequently, a greater difference in the processing times between the pre/post processing section 610 and the intermediate processing section 620 will result and the substrate transfer efficiency will be further reduced.

Further, the pre/post processing section 610 or the intermediate processing section 620 may be interrupted for a maintenance inspection while the other processing section is still in operation. This causes unnecessary waiting time for the transfer robot 603 which consequently decreases the operational efficiency of the transfer robot 603. Specifically, when the pre/post processing section 610 or the intermediate processing section 620 is halted, the transfer robot 603 is also halted making it impossible for the transfer robot 603 to perform any substrate transfers in connection with the other processing section. Consequently, the halting of one processing has the effect of halting section the other processing section which would otherwise be able to execute normal operation.

In addition, the first and second storage cassettes 601, 602 have only one opening through which a substrate is inserted and withdrawn. Accordingly, the transfer robot 603 must be moved over a considerably long distance which inevitably makes the construction of the transfer apparatus more complicated and requires a large installation space. Also, this construction increases the tact time.

SUMMARY OF THE INVENTION

It is an object of the present invention to provide a transfer apparatus for and a method of transferring a substrate between substrate processing sections which overcomes the problems of the prior art.

It is another object of the present invention to provide a substrate transfer apparatus and a substrate transfer method which can keep the halting of one processing section from affecting a subsequent processing section.

It is another object of the present invention to provide a transfer apparatus and a substrate transfer method which is smaller and assures efficient transfer of substrates.

The present invention is directed to a transfer apparatus for transferring a substrate between two processing sections, comprising a first storage cassette for storing substrates, the first storage cassette having an insertion opening oriented in the direction of a first axis and a withdrawal opening oriented in the direction of a second axis which intersects the first axis, a second storage cassette for storing substrates, the second storage cassette having an insertion opening oriented in the direction of a third axis and a withdrawal opening oriented in the direction of a fourth axis which intersects the third axis, a first transfer element for transferring a substrate from one of the two processing sections into the first storage cassette through the insertion opening of the first storage cassette and transferring a substrate from the second storage cassette to the one processing section through the withdrawal opening of the second storage cassette, and a second transfer element for transferring a substrate from the first storage cassette to the other processing section through the withdrawal opening of the first storage cassette and transferring a substrate from the other processing section into the second storage cassette through the insertion opening of the second storage cassette.

Each storage cassette may be constructed to store a plurality of substrates in a vertically stacked orientation. Also, each storage cassette may have a rectangularly horizontal cross-section and, preferably, the rectangular shape has two long sides and two short sides.

Each storage cassette may include a bottom frame member and a top frame member each having a rectangular shape, four vertically oriented pillars between the bottom frame member and the top frame member and disposed at the respective four corners thereof, and a plurality of shelf members disposed along each of the four pillars which cooperates to define vertically stacked shelves. Each shelf member preferably extends in a diagonal direction and the shelf member may have a substrate support pin disposed at an inner end thereof.

It is preferable to place the first axis and the third axis in a parallel orientation and place the second axis and the fourth axis in a parallel orientation.

It is preferable to make each of the first and second storage cassettes demountably engaged with the transfer apparatus.

It may be appreciated to further provide a moving element for reciprocatingly moving the first transfer element between the first storage cassette and the one processing section and between the second storage cassette and the one processing section. Also, it may be appreciated to further provide moving element for reciprocatingly moving the second transfer element between the second storage cassette and the other processing section and between the first storage cassette and the other processing section.

Each transfer element is preferably constructed of a base portion, a first arm mounted on the base portion, the first arm being rotatable about a first vertical axis, a second arm mounted on a lead end of the first arm, the second arm being rotatable about a second vertical axis passing through the lead end of the first arm, a hand mounted on a lead end of the second arm, the hand being rotatable about a third vertical axis passing through the lead end of the second arm, a first rotating mechanism operable to rotate the first arm about the first vertical axis, a second rotating mechanism operable to rotate the second arm about the second vertical axis, and an elevating mechanism operable to raise and lower the first arm.

The present invention is further directed to a method of transferring a substrate between two processing sections, comprising the steps of receiving a substrate from one of the two processing sections and inserting the substrate into a first storage cassette through an insertion opening oriented in the direction of a first axis, withdrawing the substrate from the first storage cassette through a withdrawal opening oriented in the direction of a second axis and placing the substrate in the other processing section, where the second axis intersects the first axis, receiving a substrate from the other of the two processing sections and inserting the substrate into a second storage cassette through an insertion opening oriented in the direction of a third axis, and withdrawing the substrate from the second storage cassette through a withdrawal opening oriented in the direction of a fourth axis and placing the substrate in the one processing section, where the fourth axis intersects the third axis.

With the substrate transfer apparatus and method of the present invention, a substrate is transferred from one of the two processing sections into the first storage cassette via the insertion opening of the first cassette using by the first transfer element, and the substrate is transferred from the first storage cassette to the other processing section via the withdrawal opening of the first storage cassette using the second transfer element. Further, a substrate is transferred from the other processing section into the second storage cassette via the insertion opening of the second cassette using the second transfer means, and the substrate is transferred from the second storage cassette to the one processing section via the withdrawal opening of the second storage cassette using by the first transfer means Accordingly, neither the first nor the second transfer elements are required to move in a transverse direction to insert or withdraw a substrate into or from the storage cassettes. This greatly reduces the amount of installation space required to install the apparatus, Further, since the transfer elements are stationary as far as transverse movement is concerned, the time required to effect a transfer is reduced and thus the tact time is reduced.

Further, one transfer element is provided between the first storage cassette and one of the two processing sections and the other transfer element is provided between the second storage cassette and the other processing section. Accordingly, a suspension in the operation of one processing section does not affect the operation of the other processing section. This assures efficient processing operation.

The above and other objects, features and advantages of the present invention will become more apparent upon a reading of the following detailed description and drawings.

BRIEF DESCRIPTION OF THE DRAWINGS

FIG. 2 is a front view of the first transfer apparatus:

DETAILED DESCRIPTION OF THE PREFERRED EMBODIMENTS OF THE INVENTION

Figure 1:
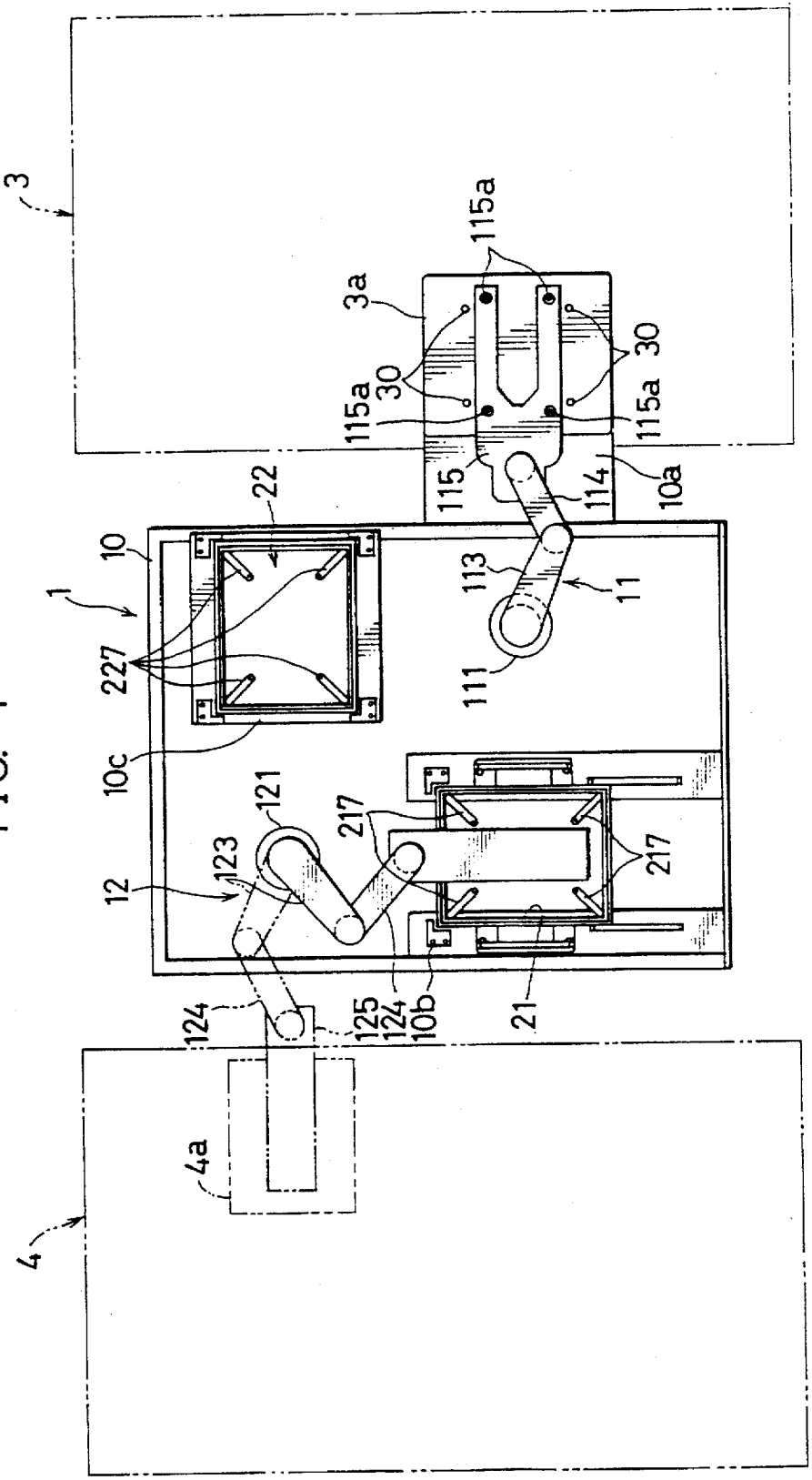
FIG. 1 is a top plan view of a first transfer apparatus embodying the present invention.
Figure 3B:
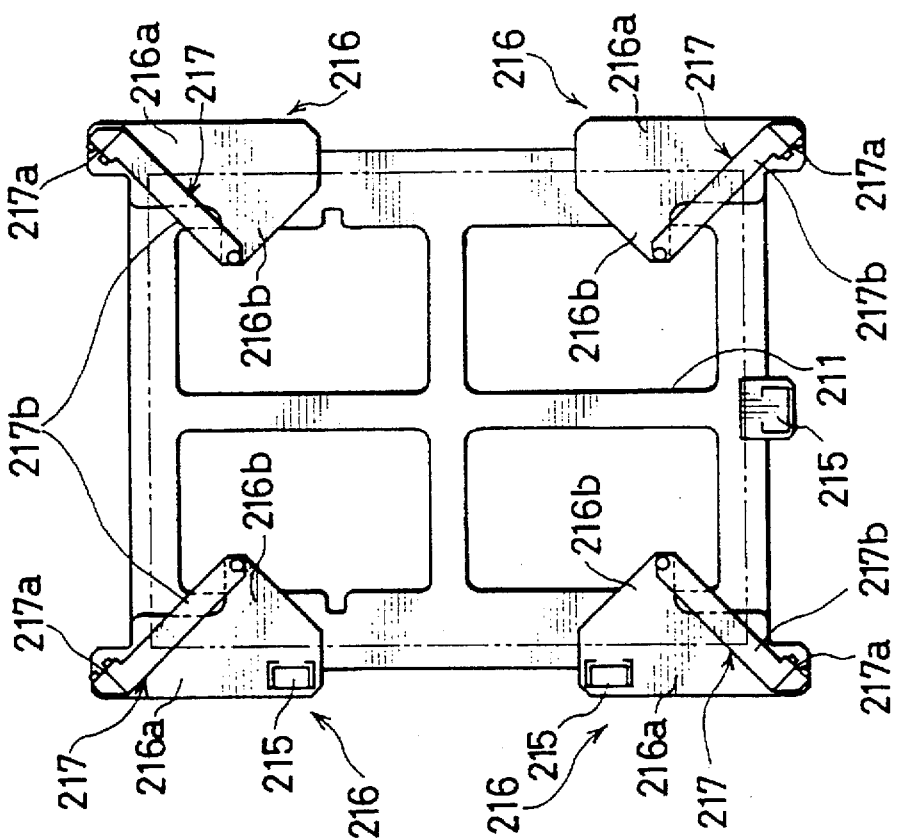
FIG. 3B is a top plan view of the storage cassette, a top frame member of the storage cassette having been removed.
Figure 3A:
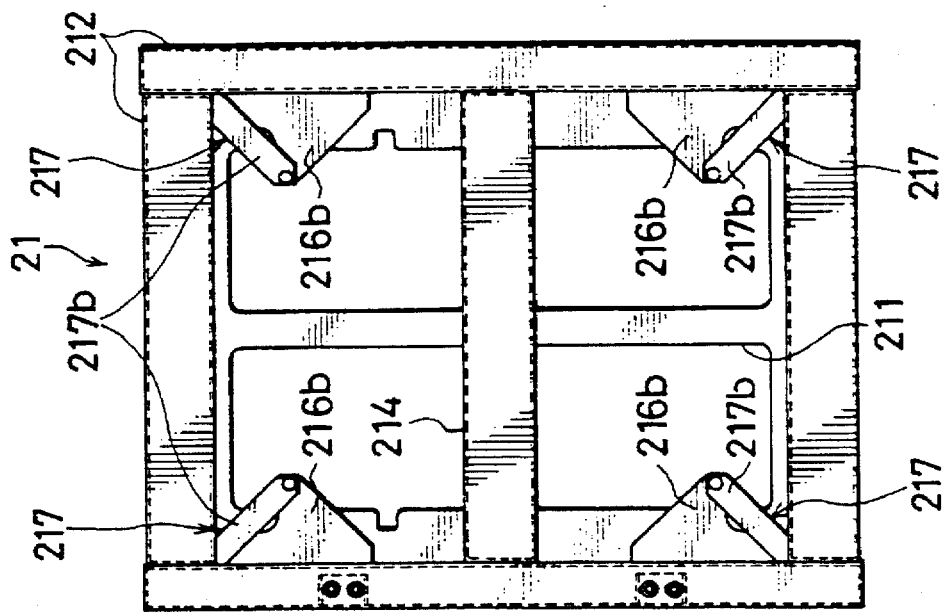
FIG. 3A is a top plan view of a storage cassette of the first transfer apparatus.
Figure 4A:
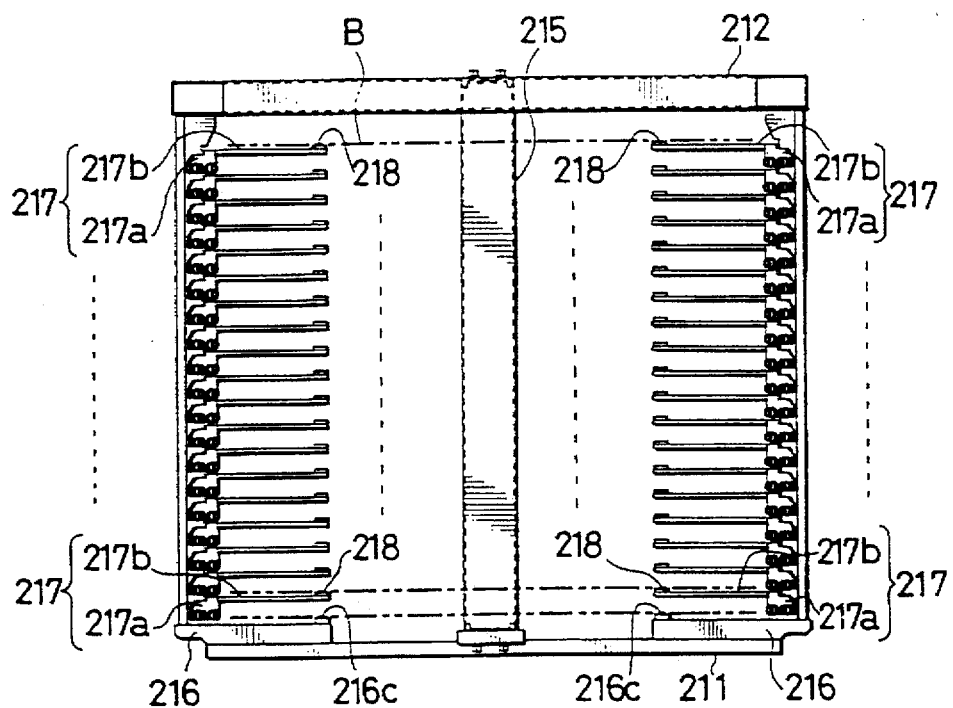
FIG. 4A is a front elevation view of the storage cassette.
Figure 4B:
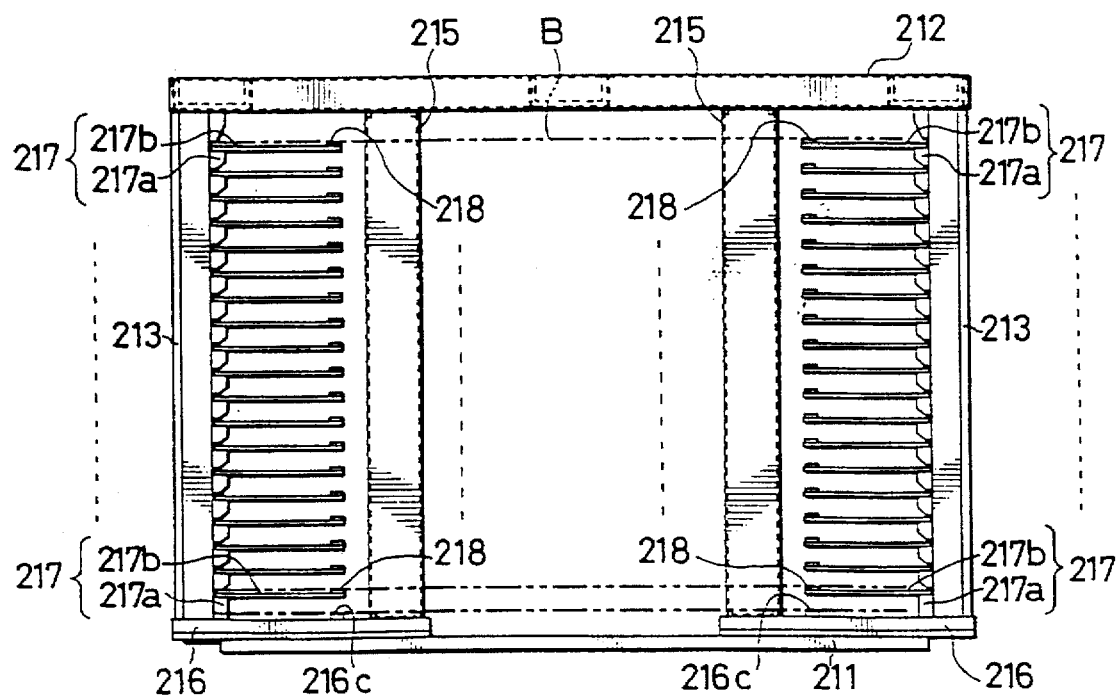
FIG. 4B is a side elevation view of the storage cassette.

Embodiments of the present invention will be described below in detail with reference to the accompanying drawings. FIG. 1 is a top plan view is a first embodiment of a transfer apparatus in accordance with the present invention. FIG. 2 is a front elevation view of the transfer apparatus of FIG. 1.

Indicated at 1 is the first embodiment of the transfer apparatus. In this embodiment, the transfer apparatus 1 is arranged between a pre/post processing section 3 and an intermediate processing section 4. More specifically, the pre/post processing section 3 includes pre-processing apparatus, i.e., a substrate cleaner, a resist coater, and a dryer and post-processing apparatus, i.e., a developer (not shown). The intermediate processing section 4 includes a pre-bake unit and an exposing apparatus for exposing a substrate with a specified pattern (not shown).

The transfer apparatus 1 includes a support base 10 substantially having the form at a rectangle on which a first transfer robot 11, a second transfer robot 12, a first storage cassette 21 and a second storage cassette 22 are placed. The first and second storage cassettes 21, 22 serve as a buffer.

Further, the transfer apparatus 1 is provided with a reception rack 3a. The reception rack 3a is mounted on an end of a support beam 10a extending from the support base 10 into the pre/post processing section 3. The reception rack 3a includes an upper supporting portion and a lower supporting portion. The lower supporting portion is adapted for supporting a substrate to be transferred from the pre-processing apparatus and the upper supporting portion is adapted for supporting a substrate to be transferred to the post-processing apparatus. Each of the upper and lower supporting portions are provided with tour support pins 30 at positions corresponding to apexes of a rectangle. A transferred substrate B is placed on respective top ends of the tour support pins 30 (see FIG. 2).

The intermediate processing section 4 is provided with a reception rack 4a. The reception rack 4a is adapted for supporting a substrate to be transferred to the intermediate processing section 4. The intermediate processing section 4 provides various types of processing, specifically, exposing a pattern on a substrate coated with resist, exposing an edge bead on a substrate, and printing a character on a substrate. The reception rack 4a is adapted for supporting a substrate to be transferred to the transfer apparatus 1 from the intermediate section 4. The reception rack 4a includes an upper supporting portion and a lower supporting portion (not shown). The upper supporting portion is adapted for supporting a substrate to be exposed, and the lower supporting portion is adapted for supporting an exposed substrate.

The first transfer robot 11, second transfer robot 12, first storage cassette 21, and second storage cassette 22 are arranged on the support base 10 in such a manner that the first and second transfer robots 11, 12 are diagonally oriented and the first and second storage cassettes 21, 22 are diagonally oriented. Specifically the reception rack 3a is located to the right of the first transfer robot 11 and the first storage cassette 21 is located to the left of the first transfer robot 11. The reception rack 4a is located to the left of the second transfer robot 12 and the second storage cassette 22 is located to the right of the second transfer robot 12. Further, the second storage cassette 22 is located to the rear of the first transfer robot 11 and the first storage cassette 21 is located in front of the second transfer robot 12.

Alternatively, depending on the specific installation location of the pre/post processing section 3 and intermediate processing section 4, the reception rack 3a may be arranged in front of the first transfer robot 11 and the reception rack 4a may be arranged to the rear of the second transfer robot 12.

The first and second storage cassettes 21 and 22 are removably mounted at storage cassette placement areas 10b, 10c, respectively, defined on the support base 10. The first and second storage cassettes 21 and 22 are mounted by tightening four fastening members which are provided at the four corners of the storage cassette placement areas 10b, 10c. The first and second storage cassettes 21, 22 are removed from the placement areas 10b, 10c by loosening the four fastening members. This enables selective mounting of the first or second storage cassette 21, 22 in accordance with the specific operations performed in the pre/post processing section 3 and intermediate processing section 4.

The second transfer robot 12 will now be described in detail and, since the first transfer robot 11 is substantially identical to the second transfer robot 12 (except the shape of a hand) a detailed description of the first transfer robot 11 is omitted.

Figure 7:
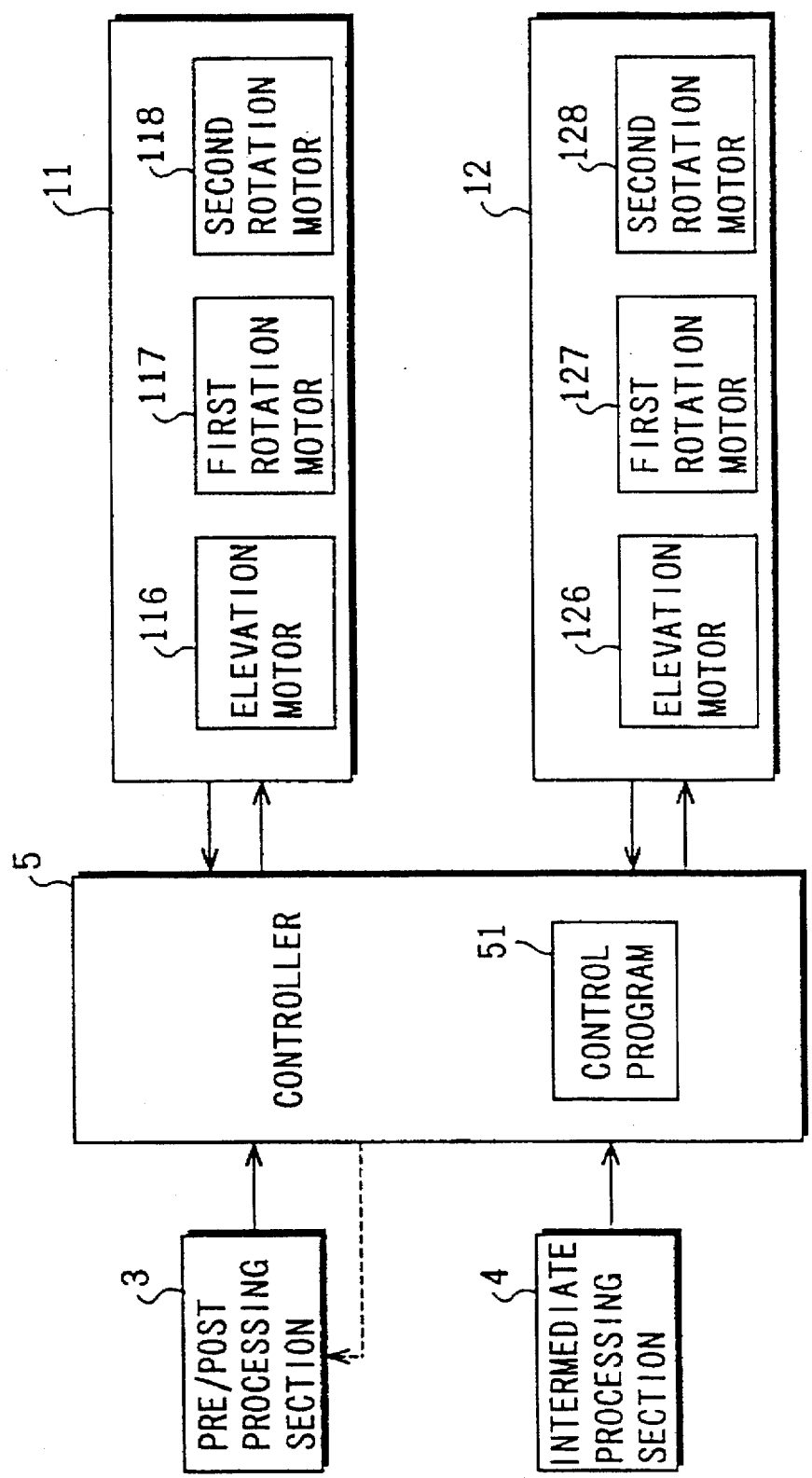
FIG. 7 is a block diagram showing a control system of the first transfer apparatus.

The second transfer robot 12 includes a base cylinder 121 and a rotary cylinder 122 provided in the base cylinder 121. The rotary cylinder 122 is rotatable with respect to the base cylinder 121 about a vertical axis of the base cylinder 121. The rotary cylinder 122 is rotated via a first rotating mechanism which includes a first rotation motor 127 (FIG. 7), and the rotary cylinder is moved upward and downward via an elevating mechanism which includes an elevation motor 126 (FIG. 7). Further, the rotary cylinder 122 is provided with an internal rotary shaft (not shown) which is rotatable with respect to the rotary cylinder 122. The rotary shaft is rotated via a second rotating mechanism which includes a second rotation motor 128 (FIG. 7).

A first arm 123 is attached to an upper end of the rotary cylinder 122 in such a manner that the first arm 123 rotates with the rotary cylinder 122. A lead end of the first arm 123 is coupled to a base end of a second arm 124. The second arm 124 is rotatable about a vertical axis passing through the lead end of the first arm 123. A lead end of the second arm 124 is coupled to a base end of a hand 125. The hand 125 is rotatable about a vertical axis passing through the lead end of the second arm 124.

First and second pulleys (not shown) are provided in the base and lead ends of the first arm 123, respectively. Still further, third and fourth pulleys are provided in the base and lead ends of the second arm 124, respectively. The second and third pulleys are coaxially arranged. Further, a first transmission belt is stretched around the first and second pulleys and a second transmission belt is stretched around the third and fourth pulleys. The first and second arms 123 and 124 have the same length. The diameter of the second pulley is one half of the diameter of the first pulley and the diameter of the third pulley is one half of the diameter of the fourth pulley.

Therefore, when the first rotation motor 127 of the first rotating mechanism and the second rotation motor 128 of the second rotating mechanism are driven in the opposite directions at the same speed, the movement of first and second arms 123, 124 contract or extend the hand 125 in a specified radial direction. When the first rotation motor 127 of the first rotating mechanism is driven in the forward or backward direction, the hand 125 is rotated about the base cylinder 121 without being contracted or extended via the first and second arms 123 and 124.

The first transfer robot 11 has a construction which is substantially identical to the above-described construction of the second transfer robot 12. However, the shape of the hand 115 of the first transfer robot 11 is different from that of the second transfer robot 12. Specifically, the hand 125 of the second transfer robot 12 is in the shape of a rectangle while the hand 115 of the first transfer robot 11 is in the shape of a fork. Each prong of the fork-shaped hand 115 is provided with two support pins 115a along the longitudinal direction of the prong. The four support pins 115a provided on the two prongs define a rectangle.

The first and second storage cassettes 21 and 22 have the shape of an elongated parallelepiped and have substantially the same construction. The first and second storage cassettes 21 and 22 are mounted on the support base 10 in such a way that their respective longer sides are oriented toward the first transfer robot 11 and their respective shorter sides are oriented toward the second transfer robot 12.

Figure 5:
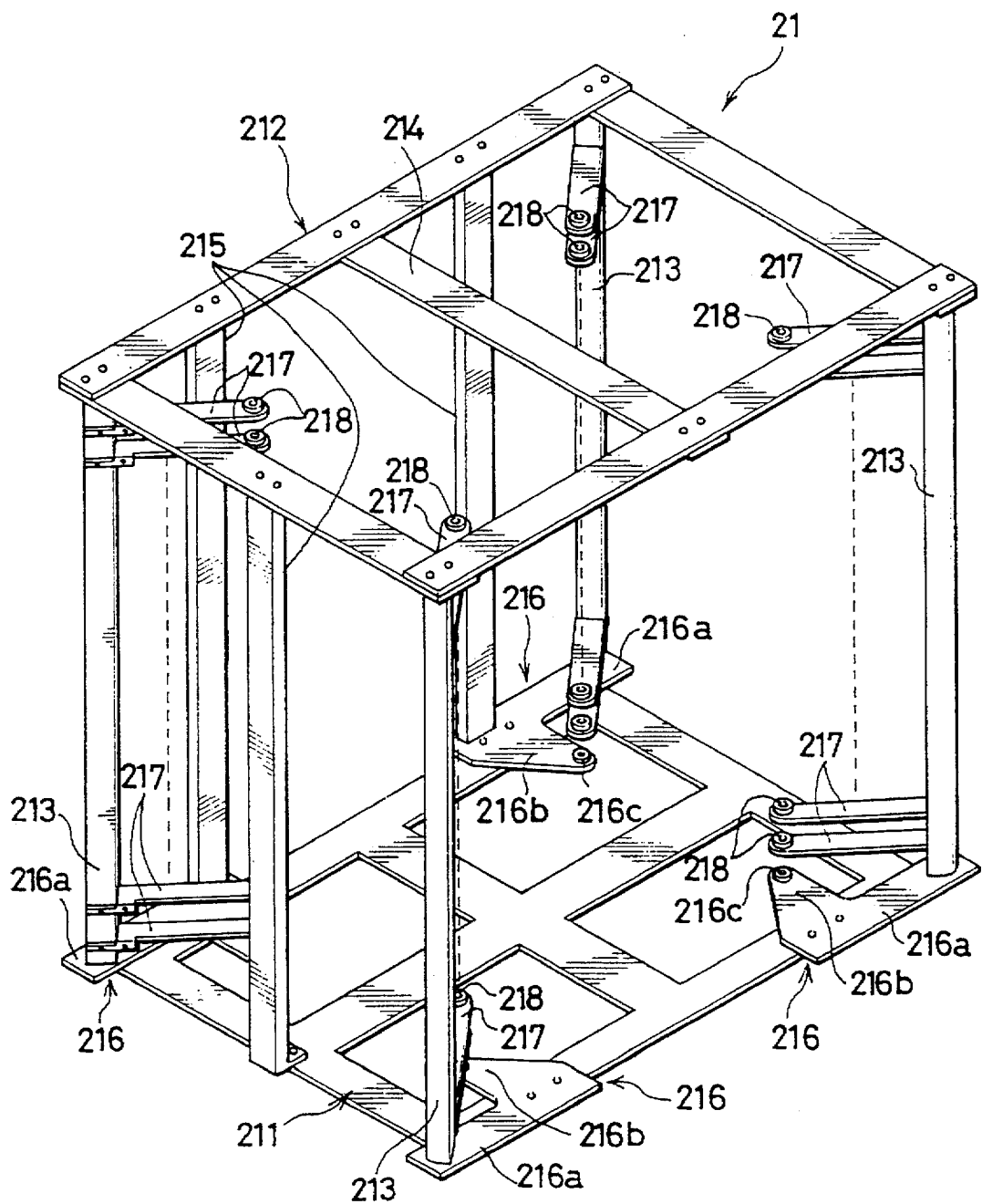
FIG. 5 is a perspective view of the storage cassette.
Figure 6:
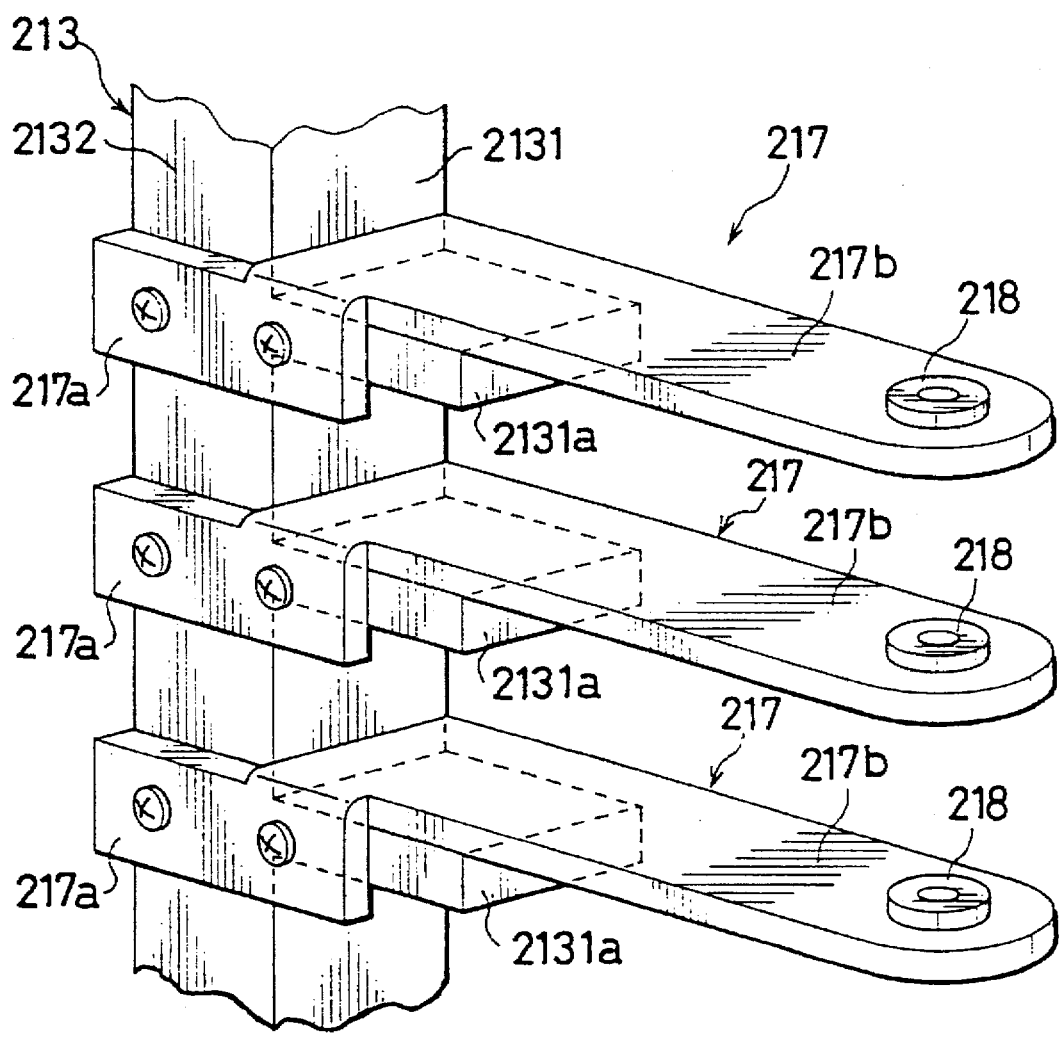
FIG. 6 is an enlarged perspective view of shelves formed in the storage cassette.

FIGS. 3 to 6 are diagrams which show the first storage cassette 21. FIG. 3A is a top plan view of the first storage cassette 21, and FIG. 3B is a top plan view of the first storage cassette 21 with a top frame member having been removed. FIG. 4A is a front elevation view of the first storage cassette 21, and FIG. 4B is a side elevation view of the first storage cassette 21. FIG. 5 is a perspective view of the first storage cassette 21. FIG. 6 is an enlarged perspective view of shelves which are disposed defined in the first storage cassette 21. Since the second storage cassette 22 has a construction which is substantially identical to the first storage cassette 21, a detailed description of the second storage cassette 22 is omitted.

The first storage cassette 21 includes a bottom frame member 211 having a rectangular shape, four pillars 213 and a top frame member 212, the top and bottom members 211, 212 being fixedly attached to the pillars 213 to form a frame of the storage cassette 21. The bottom frame member 211, while maintaining its strength, has four cutaway portions which reduce the weight of the storage cassette 21 and which define cross-shaped beams. The top frame member 212 is provided with a beam member 214 bridgingly mounted between the longer sides of the framework at an intermediate portion thereof. A plurality of reinforcing posts 215 are bridgingly mounted on one shorter side and one longer side of the framework between the bottom frame member 211 and the top frame member 212. This enables substrates to be inserted in and withdrawn from the longer side and the shorter side of the framework which are not provided with reinforcing posts.

The bottom frame member 211 is fixedly provided with corner base members 216 which are located at the four corners thereof. Each corner base member 216 is substantially L-shaped when viewed from above. Each corner base member 216 includes a main portion 216a, and an inner projection portion 216b extending into the frame from the main portion 216a. A support pin 216c is provided at an inner end of each inner projection portion 216b. The support pins 216c are arranged at such positions as to support and balance a substrate. For example, the four support pins 216c may be arranged at positions corresponding to the corners of a rectangular substrate. Alternatively, support pins 216c may be arranged at such positions as to assure minimum flexing of the substrate.

Each pillar 213 has an inner surface 2131 and side surfaces 2132 (FIG. 6). The inner surface 2131 perpendicularly intersects a vertical plane which passes through the pillar 213 and the support pin 216c. The inner surface 2131 is provided with a plurality of brackets 2131a which are equidistantly spaced at a specified interval. The brackets 2131a extend horizontally to support a shelf member 217 for supporting a substrate.

A plurality of shelf members 217 are mounted on the brackets 2131a of each pillar 213. The corresponding shelf members 217 on the pillars 213 form shelves. As shown in FIG. 6, the shelf member 217 has a fixing portion 217a and a support portion 217b. The support portion 217b horizontally extends in an inward direction from the pillar 213 into the frame. The support portion 217b is further provided with a support pin 218 at an inner end on an upper surface thereof to support a substrate. The support pin 218 is positioned on a vertical line passing through the support pin 216c of the corner base member 216.

The shelf member 217 is mounted on the pillar 213 as described below. The shelf member 217 is placed on the bracket 2131a. A base end of the shelf member 217b is then brought into contact with the inner surface 2131 of the pillar 213, and the fixing portion 217a is brought into contact with the side surfaces 2132 of the pillar 213. Finally, the fixing portion 217a is fastened to the pillar 213 via screws.

In this way, the plurality of support members 217, e.g., twenty support members, are mounted one over another in a vertically spaced apart relationship having a predetermined interval to define a plurality of shelves. It should be appreciated that the distance between the support pin 216c of the corner base member 216 and the support pin 218 of the lowermost shelf member 217 is equal to the distance between the other support pins 218.

Further, it should be appreciated that the pitch between the brackets 2131a, i.e., the distance between the support pins 218 is set in such a manner that the hand 115 of the first transfer robot 11 and the hand 125 of the second transfer robot 21 can enter the space defined by the vertically adjacent shelf members 217 without hitting the shelf members 217. In this way, a substrate can be inserted in and withdrawn from the storage cassette in two different directions which directions are normal to each other (in FIG. 3A, rightward direction and a rearward direction).

The inserting and withdrawing directions of the first storage cassette 21 are different from those of the second storage cassette 22. However this difference can be made by changing the position of the reinforcing posts 215.

Further, the reinforcing posts 215 may not necessarily be required. For instance the reinforcing posts 215 on the shorter side of the storage cassettes may be omitted and substrates can be inserted in and withdrawn from the shorter sides of the storage cassettes. Accordingly, the storage cassettes can be used more efficiently. Further, the reinforcing posts 215 on the longer side of the storage cassettes may be omitted and the efficiency of the storage cassettes can be further improved thereby.

It may be appreciated to form the bottom frame member 211 and the top frame member 212 into a square. This makes it possible to use a single type of storage cassette as the first storage cassette 21 and the second storage cassette 22 which is advantageous with respect to the manufacturing and handling of storage cassettes. Further, the reinforcing posts 215 may be omitted from the square type storage cassette. Thus, a substrate can be inserted in and withdrawn from three or four different sides of the storage cassette without requiring the consideration of the shape of the substrate.

FIG. 7 is a block diagram showing a control system of the transfer apparatus 1.

Indicated at 5 is a controller for generating various control signals such as signals concerning the reception of a substrate from the pre,post processing section 3 and the intermediate processing section 4, signals concerning the storage and organization of a substrate in the first and second storage cassettes 21 and 22, and signals concerning the operation of the first and second transfer robots 11 and 12. The controller 5 is provided with a control program 51 for processing these signals, which program 51 may be stored internally in the controller 5.

The operation signals for the first and second transfer robots 11 and 12 include drive command signals for driving the first rotation motors 117, 127 of the first and second rotating mechanisms, the second rotation motors 118, 128 of the second rotating mechanisms, and the elevation motors 116, 126 of the elevating mechanisms.

The hands 115, 125 are moved in the vertical direction, the radial direction, and in the circumferential direction by the transfer robots 11, 12 respectively. The motors of the first and second rotating mechanisms, and the elevating mechanism are pulse motors. The respective rotations of the motors are controlled by sending specified numbers of pulses to the motors and, thus the adjustment of the vertical, radial, and circumferential positions of the hands 115, 116 are affected.

Preferably, sensor or micro switch (not shown) is provided in the substrate reception racks 3a and 4a, the hands 115, 125 of the transfer robots 11, 12, or in the first and second storage cassettes 21 and 22 to detect the position of a substrate and the hands 115, 125.

Next, the transfer operation of substrates will be described in detail.

(1) The operation of the first transfer robot 11 in relation to transferring a substrate B from the reception rack 3a to the first storage cassette 21 is described in detail below.

Upon receiving a substrate reception command signal after a substrate B is placed on the lower supporting portion of the reception rack 3a from the pre/post processing section 3 (FIG. 2), the rotary cylinder 112 (not shown) of the first transfer robot 11 is raised or lowered so that the hand 115 reaches a level slightly lower than the lower supporting portion of the reception rack 3a, and is rotated so that the hand 115 faces the reception rack 3a. Thereafter, the first and second arms 113 and 114 are extended so that the hand 115 is inserted into the lower supporting portion of the reception rack 3a. Subsequently, the hand 115 is raised to receive the substrate B on the support pins 115a. After receiving the substrate B, the first and second arms 113, 114 are contracted and the rotary cylinder 112 is rotated 180° so that the hand 115 faces one of the longer side of the first storage cassette 21.

Upon receipt of an information signal identifying the shelf of the first storage cassette 21 on which the substrate B is to be stored, the hand 115 is controllably raised or lowered to a height corresponding to the designated shelf (a position slightly higher than the position of the designated shelf, but lower than the shelf immediately above the designated shelf).

Next, the first and second arms 113, 114 are extended so that the hand 115 and the substrate are inserted into the first storage cassette 21. The rotary cylinder 112 is slightly lowered to place the substrate B on the support pins 218 of the designated shelf of the first storage cassette 21. After the substrate B is placed on the support pins 218, the rotary cylinder 112 may again be lowered before the first and second arms 113, 114 are contracted so that the hand 115 is withdrawn from the first storage cassette 21. Finally, the rotary cylinder 112 is rotated to return to a specified home position.

(2) The operation of the second transfer robot 12 in relation to transferring a substrate B from the first storage cassette 21 to the reception rack 4a is described in detail below.

Upon receipt of a substrate request command, for example, from the intermediate processing section 4, the rotary cylinder 122 (FIG. 2) of the second transfer robot 12 is rotated, with the first and second arms 123, 124 being contracted, so that the hand 125 faces one of the shorter sides of the first storage cassette 21. Subsequently, upon receipt of an information signal identifying the shelf on which the substrate B to be withdrawn is currently located, the hand 125 is controllably raised or lowered to a position corresponding to the height of the designated shelf (a position slightly lower than the position of the designated shelf, but higher than the shelf immediately below the designated shelf).

Next, the first and second arms 123, 124 are extended so that the hand 125 is inserted into the first storage cassette 21. Thereafter, the rotary cylinder 122 is slightly elevated so that the hand 125 receives the substrate B. Upon receiving the substrate B, the first and second arms 123, 124 are contracted so that the hand 125 and the substrate B are withdrawn from the first storage cassette 21. Subsequently, the rotary cylinder 122 is rotated 90° so that the hand 125 laces the reception rack 4a. The hand 125 is then controllably raised or lowered to the height of the reception rack 4a. Next, the first and second arms 123, 124 are extended to transfer the substrate B to the reception rack 4a. Thereafter the first and second arms 123, 124 are contracted and the rotary cylinder 122 is rotated to return to a specified home position.

(3) The operation of the second transfer robot 12 in relation to transferring a substrate B from the reception rack 4a to the second storage cassette 22 is described in detail below.

After begin processed in the intermediate processing section 4, and upon receiving a substrate reception command signal indicating that the substrate B is to be extracted from the reception rack 4a, the rotary cylinder 122 of the second transfer robot 12 is rotated so that the hand 125 faces the reception rack 4a and is controllably raised or lowered accordingly. Subsequently, the first and second arms 123, 124 are extended so that the hand 125 is inserted below the reception rack 4a. The rotary cylinder 122 is then slightly raised in this state to receive the substrate B with the hand 125. After the hand 125 has received the substrate B, the first and second arms 123, 124 are contracted and the rotary cylinder 122 is rotated 180° so that the hand 15 faces one of the shorter sides of the second storage cassette 22.

Upon receipt of an information signal identifying the shelf of the second storage cassette 22 on which the substrate B is to be stored, the hand 125 is controllably raised or lowered to a height corresponding to the designated shelf (a position slightly higher than the position of the designated shelf, but lower than the shelf immediately above the designated shelf). Next, the first and second arms 123, 124 are extended so that the hand 125 and the substrate B is inserted into the second storage cassette 22. Thereafter, the rotary cylinder 122 is slightly lowered to place the substrate B on the designated shelf of the second storage cassette 22. After the substrate B is in position, the rotary cylinder 122 may again be slightly lowered and the first and second arms 123, 124 are contracted so that the hand 125 is withdrawn from the second storage cassette 22. Finally, the rotary cylinder 122 is rotated to return to a specified home position.

(4) The operation of the first transfer robot 11 with respect to transferring a substrate B from the second storage cassette 22 to the reception rack 3a is described in detail below.

Upon receipt of the substrate request command from, for example, the pre/post processing section 3, the rotary cylinder 112 of the first transfer robot 12 is rotated, with the first and second arms 113, 114 being contracted, so that the hand 115 faces one of the longer sides of the second storage cassette 22. Subsequently, upon receipt of an information signal identifying the shelf on which the substrate B to be withdrawn is currently located, the hand 115 is controllably raised or lowered to a position corresponding to the height of the designated shelf (a position slightly lower than the position of the designated shelf, but higher than the shelf right below the designated shelf).

Next, the first and second arms 113, 114 are extended so that the hand 115 is inserted into the second storage cassette 22. Thereafter, the rotary cylinder 112 is slightly raised to receive the substrate B with the hand 115. Upon receiving the substrate B on the hand 115, the first and second arms 113, 114 are contracted so that the hand 115 and the substrate B are withdrawn from the second storage cassette 22. Subsequently, the rotary cylinder 112 is rotated 90° so that the hand 115 faces the reception rack 3a. The hand 115 is then controllably raised or lowered to a position slighter higher than the height of the upper supporting portion of the reception rack 3a. Next, the first and second arms 113, 114 are extended so that the hand 115 and the substrate B are inserted into the upper supporting portion of the reception rack 3a. The substrate B is then transferred to the reception rack 3a by slightly lowering the hand 115. Thereafter, the first and second arms 113, 114 are contracted and the rotary cylinder 112 is rotated to return the rotary cylinder to a specified home position.

In this embodiment, the rotating directions of the first and second transfer robots 11, 12 during the transfer of the substrate B are not fixed, i.e., the transfer robots 11, 12 may be rotated in any direction. In order to shorten the tact time, it is preferable to rotate the respective transfer robots 11, 12 in such directions as to minimize rotating distance.

In this embodiment, two transfer robots are provided i.e., the first and second transfer robots 11, 12, and the first and second storage cassettes 21, 22 act as storage buffers which permit the substrates B to be inserted into and withdrawn from the respective sides of the storage cassettes 21, 22 where the orientations of the openings in the sides of the storage cassettes 21, 22 lie in the respective direction of two intersection axes as described above. Accordingly, the transfer apparatus 1 can satisfactorily function even if the substrate request command is given from both the pre/post processing section 3 and the intermediate processing section 4. Also, the transfer apparatus 1 can operate despite a difference between the tact time in the pre/post processing section 3 and the tact time in the intermediate processing section 4. Further, depending upon the construction of the first and second storage cassettes 21, 22, the installation space for the transfer apparatus 1 including the first and second transfer robots 11, 12 can be reduced.

Figure 8:
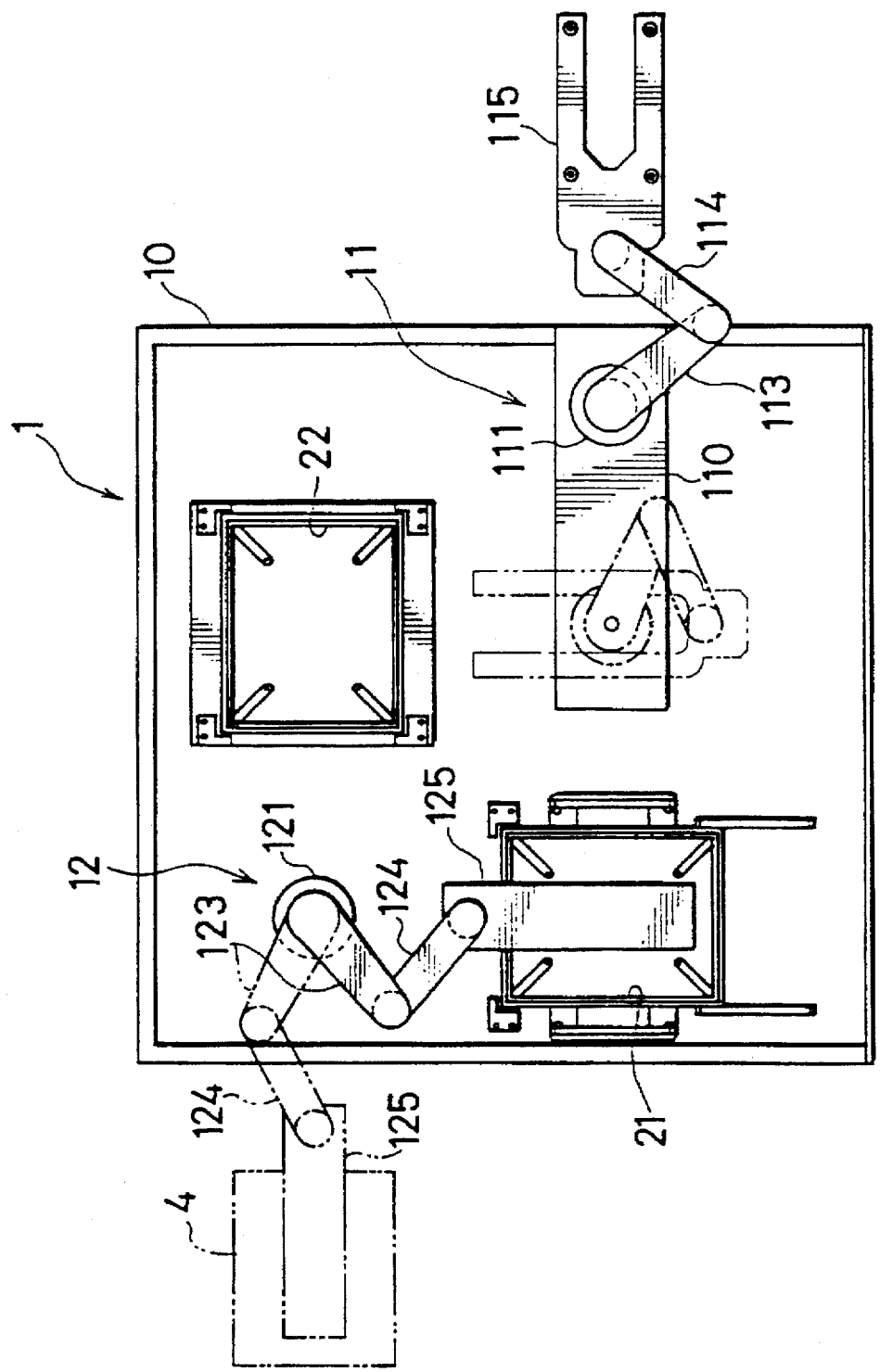
FIG. 8 is a top plan view of a second transfer apparatus embodying the present invention.

FIG. 8 is a top plan view of a second transfer apparatus according to the present invention. The second transfer apparatus differs from the first transfer apparatus in that a first transfer robot 11 of the second apparatus is reciprocatingly movable in a transverse direction over a specified distance.

More specifically, a base cylinder 111 of the first transfer robot 11 is attached to a movable support table 110. The movable support table 110 is formed with an internally threaded hole in a lower portion thereof. A motor driven drive shaft is coupled to the threaded hole, which drive shaft is extendable and retractable in the transverse direction. Specifically, the drive shaft includes a threaded member and a bearing, for example a ball bearing. The ball bearing is coupled to the internally threaded hole of the movable support table 110. Further, a guide stay is arranged in parallel relation to the drive shaft. By activating the motor of the drive shaft, the support table 110 is moved in the transverse direction. Accordingly, even if the substrate reception position in the pre/post processing section 3 farther from the support base 10 than in the first embodiment, the support table 110 carrying the first transfer robot 11 may be moved close enough to the reception position to receive a substrate B and, thus, the substrate B can thus be transferred from the reception position to the first storage cassette 21 within a relatively short tact time.

Figure 9:
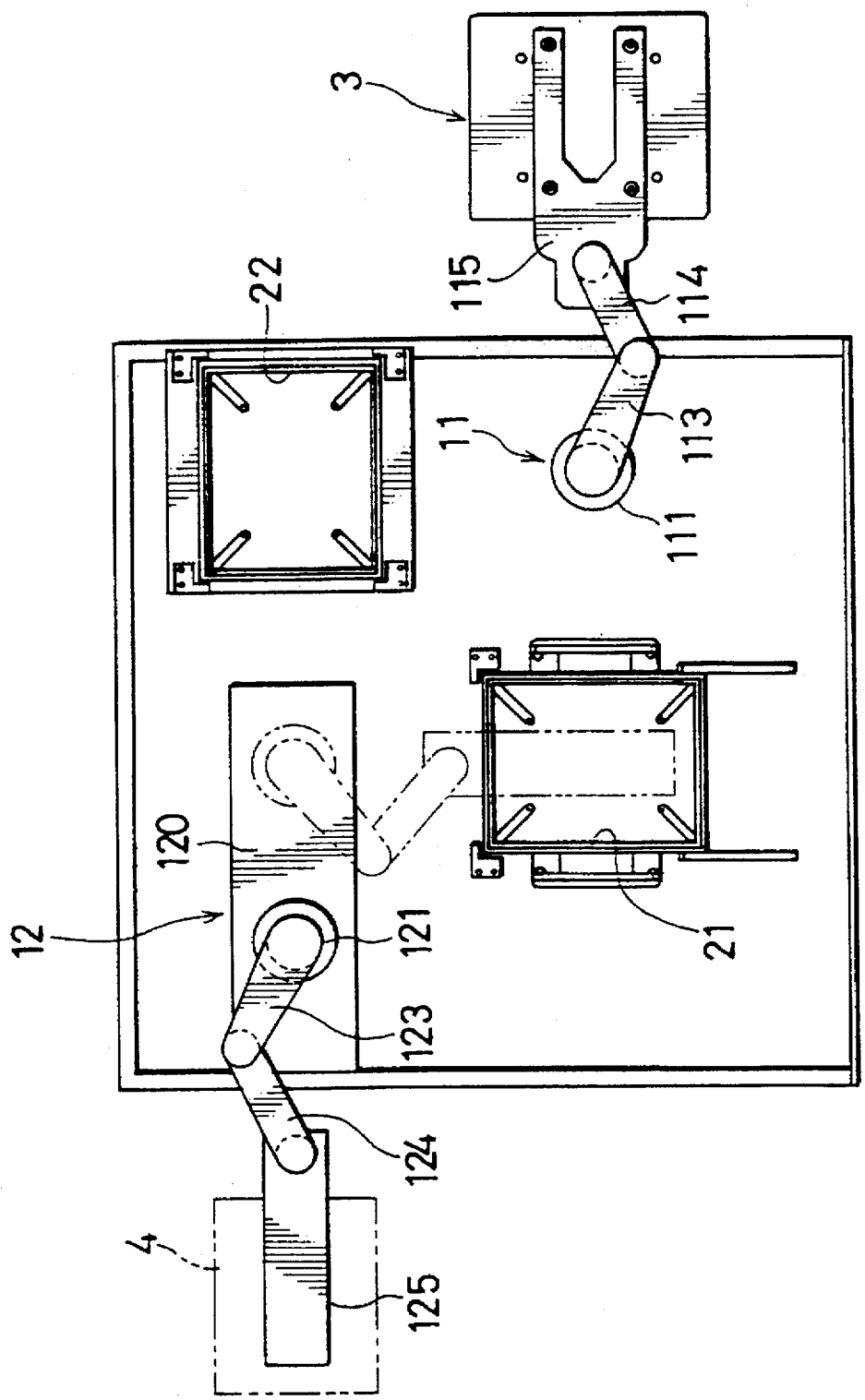
FIG. 9 is a top plan view of a third transfer apparatus embodying the present invention.

FIG. 9 is a top plan view of a third transfer apparatus according to the present invention. The third transfer apparatus differs from the first transfer apparatus in that a second transfer robot 12 of the third transfer apparatus is reciprocatingly movable in a transverse direction over a specified short distance. Specifically the second transfer robot 12 is mounted on a movable support table 120 which is movable in the transverse direction by a similar mechanism as the second transfer apparatus described above. Accordingly, even if the substrate reception position of the intermediate processing section 4 is farther from the support base 10 than in the first embodiment, the support table 120 carrying the second transfer robot 12 may be moved close enough to the reception position to receive a substrate B, thus, the substrate B can thus be transferred from the reception position to the second storage cassette 21 within a relatively short tact time.

Figure 10:
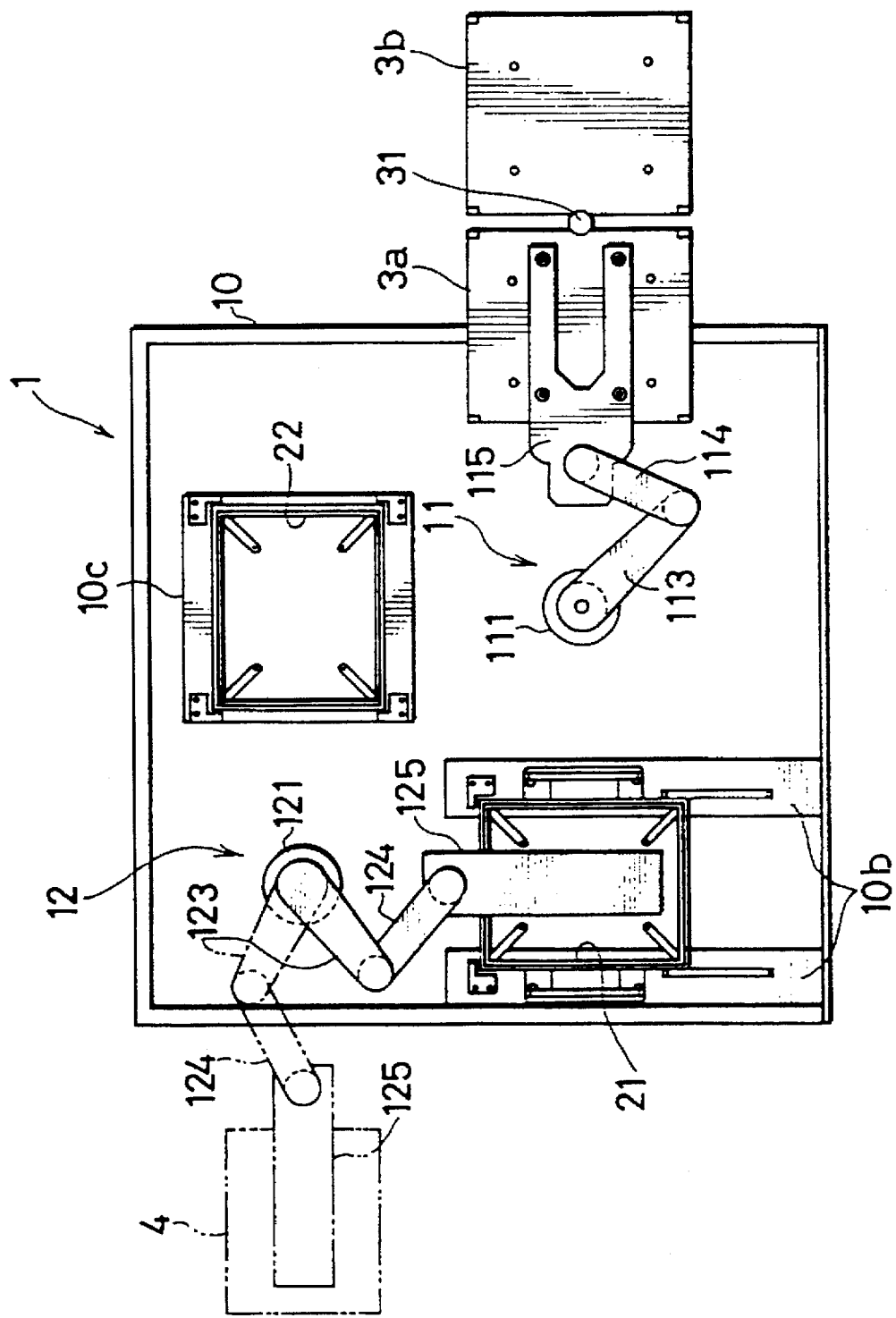
FIG. 10 is a top plan view of a fourth transfer apparatus embodying the present invention.
Figure 11:
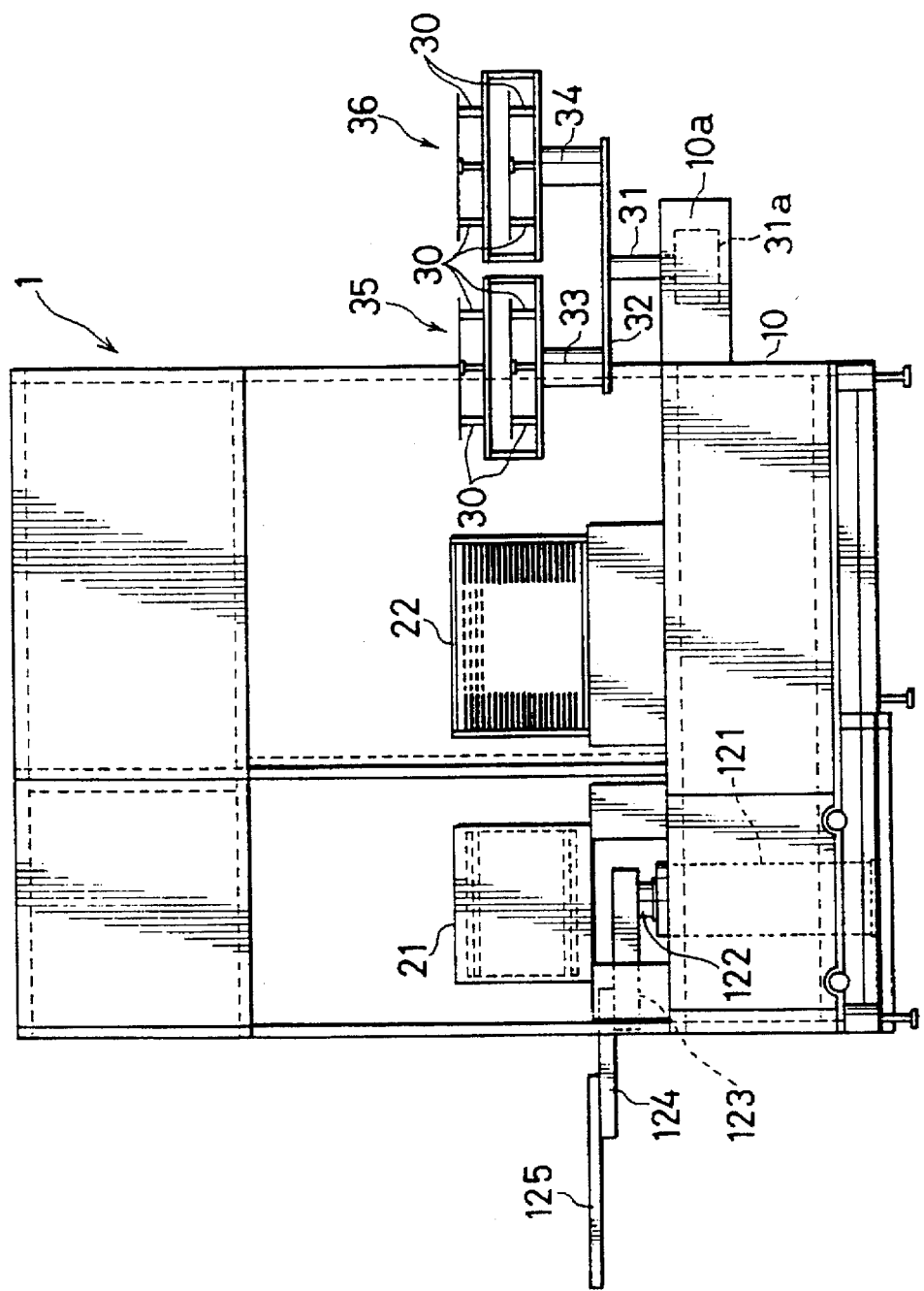
FIG. 11 is a front elevation view of the fourth transfer apparatus.
Figure 12:
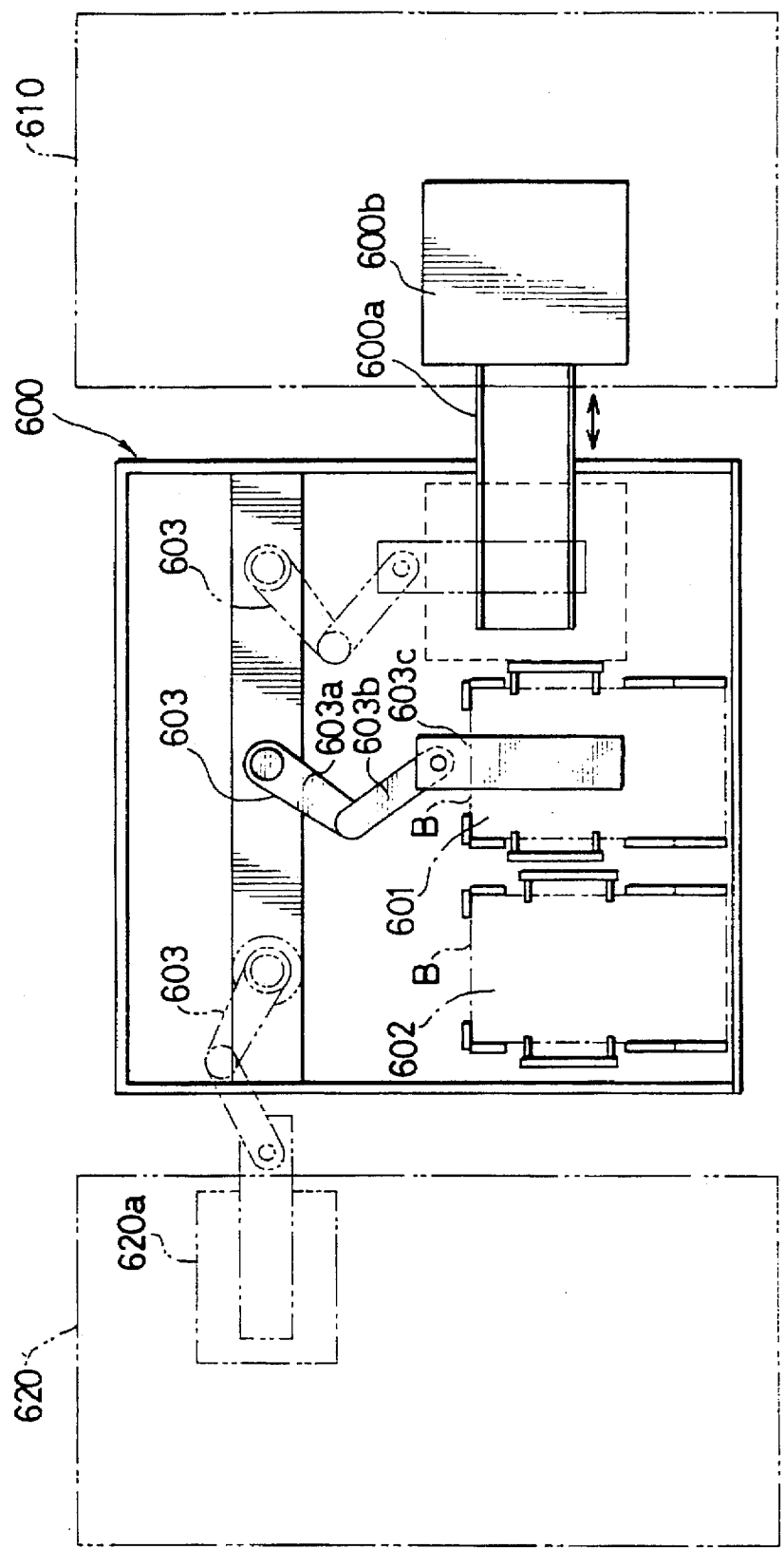
FIG. 12 is a top plan view of a transfer apparatus of the prior art.

FIG. 10 is a top plan view of a fourth transfer apparatus according to the present invention and FIG. 11 is a front elevation view of the fourth transfer apparatus where the first transfer robot has been removed.

The fourth transfer apparatus differs from the first transfer apparatus only in the construction of a reception rack. More specifically, a rotary shaft 31 is rotatably mounted on a support beam 10a which horizontally extends from a support base 10. The rotary shaft 31 is rotated via a motor 31a provided in the support beam 10a.

A horizontal plate member 32 having a specified length is mounted on the rotary shaft 31. Specifically, a center of the horizontal plate member 32 is fixedly attached to the top end of the rotary shaft 31. Further, support blocks 33, 34 are mounted on opposite ends of the horizontal plate member 32. Substrate reception racks 35, 36, having identical configurations, are mounted on the support blocks 33, 34. The reception racks 35, 36 are the same as the reception rack 3a of the first transfer apparatus.

By driving the motor 31a in the support beam 10a, the rotary shaft 31 is rotated 18° the reception racks 35, 36 are alternately brought to a position facing the first transfer robot 11. By providing the two identically configured reception racks 35, 36, it is possible to simultaneously respond to a substrate reception command to the first transfer robot 11 and a substrate request command from the pre/post processing section 3. Therefore, the tact time required for the transfer of substrates can be shortened as much as possible.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. A transfer apparatus for transferring a substrate between first and second processing sections, comprising:
   a first storage cassette for storing substrates, said first storage cassette having an insertion opening oriented in a first direction and withdrawal opening oriented in a second direction intersecting said first direction;
   a second storage cassette for storing substrates, said second storage cassette having an insertion opening oriented in a third direction and a withdrawal opening oriented in a fourth direction intersecting said third direction;
   a first transfer element for transferring a substrate from said first processing section into said first storage cassette through the insertion opening of said first storage cassette and for transferring a substrate from said second storage cassette to said first processing section through said withdrawal opening of a second storage cassette; and
   a second transfer element for transferring a substrate from said first storage cassette to said second processing section via said withdrawal opening of said first storage cassette and for transferring a substrate from said second processing section into said second storage cassette through said insertion opening of said second storage cassette.

2. The transfer apparatus as defined in claim 1, wherein each of said first and second storage cassettes includes shelves for storing a plurality of substrates in vertical stacked orientations.

3. The transfer apparatus as defined in claim 2, wherein each storage cassette has the shape of a rectangle when viewed from above.

4. The transfer apparatus as defined in claim 3, wherein each of said rectangular shaped cassettes has two long sides and two short sides.

5. The transfer apparatus as defined in claim 3, wherein each storage cassette includes:
   a bottom frame member and a top frame member, each having a rectangular shape;
   four pillars provided in a vertical orientation between said bottom frame member and said top frame member and disposed at the respective four corners of said frame members; and
   a plurality of shelf members coupled to each of said four pillars, said shelf members on each pillar being disposed along the length thereof at a corresponding interval to define vertically stacked shelves.

6. The transfer apparatus as defined in claim 5, wherein each shelf member extends in a diagonal direction into said respective cassettes.

7. The transfer apparatus as defined in claim 6, wherein each shelf member is provided with a substrate support pin at an inner end thereof.

8. The transfer apparatus as defined in claim 1, wherein said first, second, third and fourth directions, correspond with a first, a second, a third and a fourth axes respectively, said first and third axes being in parallel with each other, and said second and fourth axes being in parallel with each other.

9. The transfer apparatus as defined in claim 1, wherein each of said first and second storage cassettes are removably mounted.

10. The transfer apparatus as defined in claim 1, further comprising a first moving element for reciprocatingly moving said first transfer element between said first storage cassette and said first processing section and between said second storage cassette and said first processing section.

11. The transfer apparatus as defined in claim 10, further comprising a second moving element for reciprocatingly moving said second transfer element between said second storage cassette and said second processing section and between said first storage cassette and said second processing section.

12. The transfer apparatus as defined in claim 1, wherein each of said first and second transfer elements includes:
   a base portion;
   a first arm coupled to said base portion, said first arm being rotatable about a first vertical axis passing through said base portion;
   a second arm mounted on a lead end of said first arm, said second arm being rotatable about a second vertical axis passing through the lead end of said first arm;
   a hand mounted on a lead end of said second arm, said hand being rotatable about a third vertical axis passing through the lead end of said second arm;
   a first rotating mechanism operable to rotate said first arm;
   a second rotating mechanism operable to rotate said second arm; and an elevating mechanism operable to raise and lower said first arm.

13. A method of transferring a substrate between first and second processing sections, comprising the steps of:

(a) receiving said substrate from said first processing section and inserting said substrate into a first storage cassette through an insertion opening oriented in a first direction;

(b) withdrawing said substrate from said first storage cassette via a withdrawal opening oriented in a second direction and placing said substrate in said second processing section, said second directional orientation intersecting said first directional orientation;

(c) receiving said substrate from said second processing section and inserting said substrate into a second storage cassette through an insertion opening oriented in a third direction; and (d) withdrawing said substrate from said second storage cassette via a withdrawal opening oriented in a fourth direction and placing said substrate in said first processing section, said fourth directional orientation intersecting said third directional orientation.

14. The method as defined in claim 13, wherein the step of inserting said substrate into said first storage cassette in said first directional orientation includes inserting said substrate in a direction parallel and opposite to said third directional orientation, and the step of withdrawing said substrate from said first storage cassette in said second directional orientation includes withdrawing said substrate in a direction parallel and opposite to said fourth directional orientation.

\* \* \* \* \*